United States Patent [19]
Han et al.

[11] Patent Number: 5,934,079
[45] Date of Patent: Aug. 10, 1999

[54] BASE STATION HEAT MANAGEMENT SYSTEM

[75] Inventors: Jake Jin Kyu Han, Dallas; Michael A. Flores, Plano, both of Tex.

[73] Assignee: Samsung Electronics Co., Ltd., Rep. of Korea

[21] Appl. No.: 09/036,011

[22] Filed: Mar. 6, 1998

Related U.S. Application Data

[60] Provisional application No. 60/058,229, Sep. 9, 1997.

[51] Int. Cl.⁶ .................................................. F25B 21/02
[52] U.S. Cl. ............................ 62/3.2; 62/3.6; 62/259.2
[58] Field of Search ............................ 62/3.2, 3.3, 3.6, 62/3.7, 259.2, 332

[56] References Cited

U.S. PATENT DOCUMENTS

| | | | |
|---|---|---|---|
| 4,328,676 | 5/1982 | Reed | 62/3 |
| 5,655,375 | 8/1997 | Ju | 62/3.6 |
| 5,661,978 | 9/1997 | Holmes | 62/3.6 |
| 5,704,212 | 1/1998 | Erler | 62/3.2 |

*Primary Examiner*—Henry Bennett
*Assistant Examiner*—Melvin Jones
*Attorney, Agent, or Firm*—Jenkens & Gilchrist, P.C.

[57] ABSTRACT

A two-stage base station enclosure heat management system is disclosed. The system eliminates the need for a compressor-driven cooling system while providing heating and cooling temperature regulation for a main chamber and a physically isolated battery chamber.

51 Claims, 8 Drawing Sheets

BASE STATION HEAT MANAGEMENT SYSTEM

CROSS REFERENCE TO RELATED APPLICATIONS

This application claims the benefit under Title 35 United States Code §119(e) of U.S. Provisional Application Ser. No. 60/058,229, filed Sep. 9, 1997.

FIELD OF THE INVENTION

The present invention generally relates to wireless communication systems and, more particularly, to a system and method for heating and cooling base station enclosures in wireless communication systems.

BACKGROUND OF THE INVENTION

FIG. 1 graphically illustrates a wireless communication system comprising a mobile station 10, a base station 20, a reverse link 30 which represents the electromagnetic wave communication link transmitted from mobile station 10 to base station 20 and a forward link 40 which represents the electromagnetic wave communication link transmitted from base station 20 to mobile station 10.

In such a wireless communication system based on the cellular principle a service area 49 is divided geographically, as shown in FIG. 2, into a number of small areas 50, 52, 54, 56 called "cells," hence the name "cellular." In each cell there is a cell site 58, 60, 62, 64, respectively, where radio equipment known as the Base Station Transceiver Subsystem (BTS) is installed. Multiple cell layouts, such as macro cells, micro cells, and pico cells can be provided within a particular geographical area to effect a hierarchical coverage area wherein macro cells provide the largest coverage and pico cells the smallest. Pico cells may be used for inside public and business buildings; special area coverage, e.g., campus, stadium, airport and shopping mall; supplementing macro or mini cells with hole-filling and capacity enhancement of hot spots; temporary coverage for special events or areas hit by natural disasters; or outlying remote locations.

As shown in FIG. 3, a BTS 66' provides a link to mobile subscribers or a mobile station 10. BTSs 66 and 66' are coupled to a Base Station Controller (BSC) 70 and may include one or more antennas 67 and 67'. Multiple BTSs 66 may be coupled to a single BSC 70. Each BSC 70 is coupled to a Mobile Switching Center (MSC) 72 and the MSC 72 is in turn coupled to a Public Switched Telephone Network (PSTN) 68.

As shown in FIG. 4, a conventional BTS 66 comprises five major functional blocks: an RF Front-End 74, a plurality of Transceivers 76, a plurality of MODEM Processors 78, a Controller 80, and a Battery Backup Unit 82 comprising a multiplicity of batteries. Controller 80 interfaces with BSC 70 over a T1 or E1 line 81, and RF Front-End 74 is connected to the antennas 67 which are typically mounted at the top of a tower or pole.

In a typical system, the five major functional blocks shown in FIG. 4 are contained in one or more physical housings. The housings are typically hermetically sealed enclosures used to package and protect the internal electronic equipment from adverse environmental effects and unauthorized access. While the electronics may be located in a main chamber, the batteries of battery backup unit 82 are typically enclosed in a battery chamber separated and sealed from the main chamber to meet industrial standards.

Since BTS units 66 are installed outdoors as well as indoors, where ambient temperatures can range from −40° C. to +50° C., a heating/cooling temperature management system is required to regulate the internal enclosure temperature between +5° C. to +65° C. during BTS operation. Conventional base station heating/cooling temperature management systems have utilized a single step cooling/heating process with a compressor-driven cooling system or a conventional flat-plate heat exchanger. Such systems have encountered high failure rates and high maintenance costs. Also, these systems are unnecessarily large and heavy, making transportation, installation and removal extremely difficult, and, especially with compressor-driven cooling systems, unnecessary amounts of power are consumed. Additionally, since the batteries of the battery backup unit 82 are enclosed in a separate chamber from the main chamber 110, the batteries receive no special heating and cooling (due to isolation from the main chamber 110).

Thus, what is needed is a heating/cooling system for a base station which eliminates the need for a compressor-driven cooling system and which concurrently provides heating and cooling temperature management of the battery chamber as well as the main chamber.

SUMMARY OF THE INVENTION

Accordingly, the present invention provides a system and method for heating and cooling, for example, a base station enclosure in a wireless communication system. The base station heat management system of the present invention comprises heat pipes and thermal electric elements to provide a two-stage heating/cooling process for regulating the temperature of the electronics in a main housing chamber as well as the batteries in a battery chamber sealed and separated from the main chamber.

A heat management system for an enclosure may comprise an ambient chamber contiguous with a closed loop chamber, a battery chamber contiguous with the closed loop chamber, a supply vent in fluid communication with the ambient chamber, one or more heat pipes in thermal communication with the ambient chamber and the closed loop chamber, one or more thermal electric cooling elements in thermal communication with the ambient chamber and the closed loop chamber, an external fan in fluid communication with the ambient chamber, an exhaust vent in fluid communication with the ambient chamber, an internal fan in fluid communication with the internal chamber, and a heat sink in thermal communication with the closed loop chamber and the battery chamber.

Further, the external fan may operate to draw ambient air into the supply vent, across the heat pipes, across the thermal electric cooling elements, and out of the exhaust vent. The internal fan may operate to draw internal air across the heat pipes and may operate to draw internal air across the thermal electric cooling elements. The internal fan may also operate to draw internal air across the heat sink. The heat management system may further comprise an air duct in fluid communication with the internal fan. Furthermore, the battery chamber may be insulated. The temperature of the battery chamber may be maintained at about 55° C. when the temperature of the ambient air is about 50° C. Additionally, the battery chamber may be heated. The thermal electric cooling elements may also be used to heat the closed loop chamber. A thermostat may be used to monitor the temperature of the closed loop chamber. Further, a heat management system controller may be used to control the operation of the internal fan, external fan, and the thermal electric cooling elements. The system controller may be used to control the operating speed of the internal and external fans. Additionally, a heat management system controller may use a thermostat to monitor the temperature of the closed loop chamber.

Another aspect of the invention comprises a heat management system for an enclosure comprising an ambient chamber contiguous with a closed loop chamber, a battery chamber contiguous with the closed loop chamber, a supply vent in fluid communication with the ambient chamber, one or more heat pipes in thermal communication with the ambient chamber and the closed loop chamber, an external fan in fluid communication with the ambient chamber, an exhaust vent in fluid communication with the ambient chamber, an internal fan in fluid communication with the internal chamber, and a heat sink in thermal communication with the closed loop chamber and the battery chamber.

Further, the external fan may operate to draw ambient air into the supply vent, across the heat pipes, and out of the exhaust vent. The internal fan may operate to draw internal air across the heat pipes and may also operate to draw internal air across the heat sink. The heat management system may further comprise an air duct in fluid communication with the internal fan. Additionally, the battery chamber may be heated. One or more thermal electric cooling elements may be used to heat the closed loop chamber. A thermostat may be used to monitor the temperature of the closed loop chamber. Furthermore, a heat management system controller may be used to control the operation of the internal and external fans. The system controller may also be used to control the operating speed of the internal and external fans.

A further aspect of the invention comprises a heat management system for an enclosure comprising an ambient chamber contiguous with a closed loop chamber, a battery chamber contiguous with the closed loop chamber, a supply vent in fluid communication with the ambient chamber, one or more thermal electric cooling elements in thermal communication with the ambient chamber and the closed loop chamber, an external fan in fluid communication with the ambient chamber, an exhaust vent in fluid communication with the ambient chamber, an internal fan in fluid communication with the internal chamber, and a heat sink in thermal communication with the closed loop chamber and the battery chamber.

In addition, the external fan may operates to draw ambient air into the supply vent, across the thermal electric cooling elements, and out of the exhaust vent. The internal fan may operate to draw internal air across the thermal electric cooling elements and may also operate to draw internal air across said heat sink. An air duct may be in fluid communication with the internal fan. Additionally, the battery chamber may be heated. The thermal electric cooling elements may be used to heat the closed loop chamber. A thermostat may be used to monitor the temperature of the closed loop chamber. Further, a heat management system controller may be used to control the operation of the internal and external fans. The system controller may also be used to control the operating speed of the internal and external fans.

The present invention also provides a method of heat management for an enclosure comprising the steps of drawing ambient air into a supply vent using an external fan, the supply vent and external fan being in fluid communication with an ambient chamber, the ambient chamber being contiguous with a closed loop chamber, the closed loop chamber being contiguous with a battery chamber; drawing ambient air past one or more thermal electric cooling elements, the thermal electric cooling elements being in thermal communication with the ambient chamber and the closed loop chamber; drawing ambient air out of an exhaust vent, the exhaust vent being in fluid communication with the ambient chamber; and circulating internal air past a heat sink using an internal fan, the internal fan being in fluid communication with the internal chamber and the heat sink being in thermal communication with the closed loop chamber and the battery chamber.

The method of heat management may further comprise the step of drawing internal air across the thermal electric cooling elements; and/or the step of drawing internal air through an air duct using the internal fan, the air duct being in fluid communication with the internal fan; and/or the step of heating the closed loop chamber using the thermal electric cooling elements; and/or the step of changing the operating speed of the internal and external fans; and/or the step of drawing ambient air past one or more heat pipes, the one or more heat pipes being in thermal communication with the ambient chamber and the closed loop chamber. The method may then further comprise the step of drawing internal air across the heat pipes.

One advantage of the present invention is the provision of a base station heat management system which eliminates the need for a compressor-driven cooling system.

Another advantage of the present invention is a base station heat management system which heats and cools the main chamber as well as the battery chamber of the base station.

DETAILED DESCRIPTION OF A PREFERRED EMBODIMENT OF THE INVENTION

In the description which follows, a preferred embodiment of the invention is described for a pico cell-based base station. However, it will be understood that the present invention may be used for any base station system in a wireless communication system, including, but not limited to, macro and micro cell-based base stations.

Figure 1:
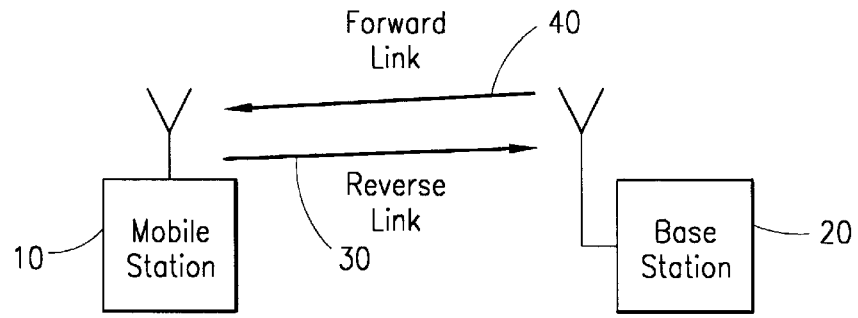
FIG. 1 is a prior art graphical representation of a wireless communication system.
Figure 2:
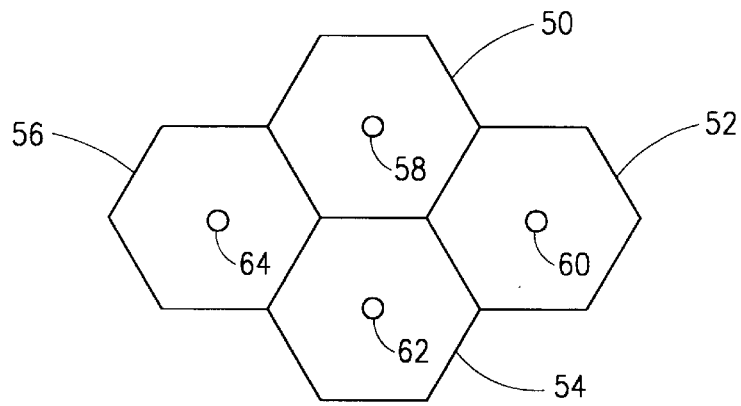
FIG. 2 is a prior art graphical representation of a cellular communications grid and cell sites.
Figure 3:
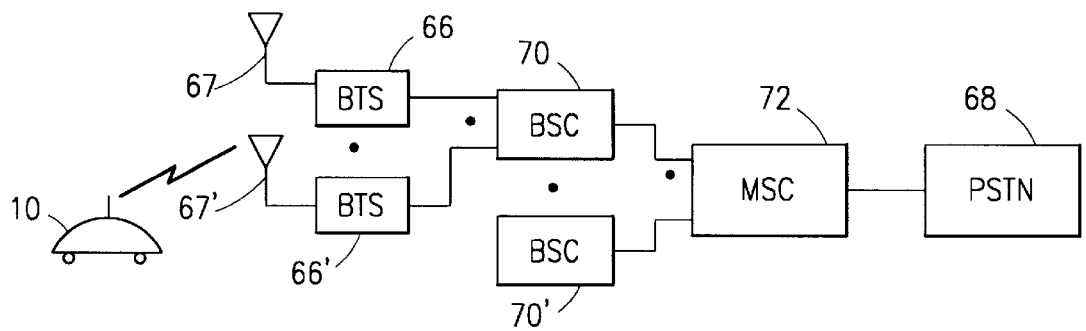
FIG. 3 is a prior art block diagram of a base station transceiver system (BTS) shown connected to a land-line PSTN.
Figure 4:
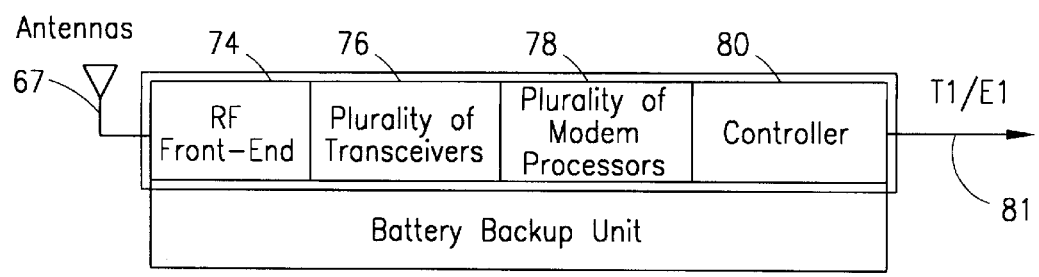
FIG. 4 is a prior art functional block diagram of a BTS.
Figures 5A, 5B:
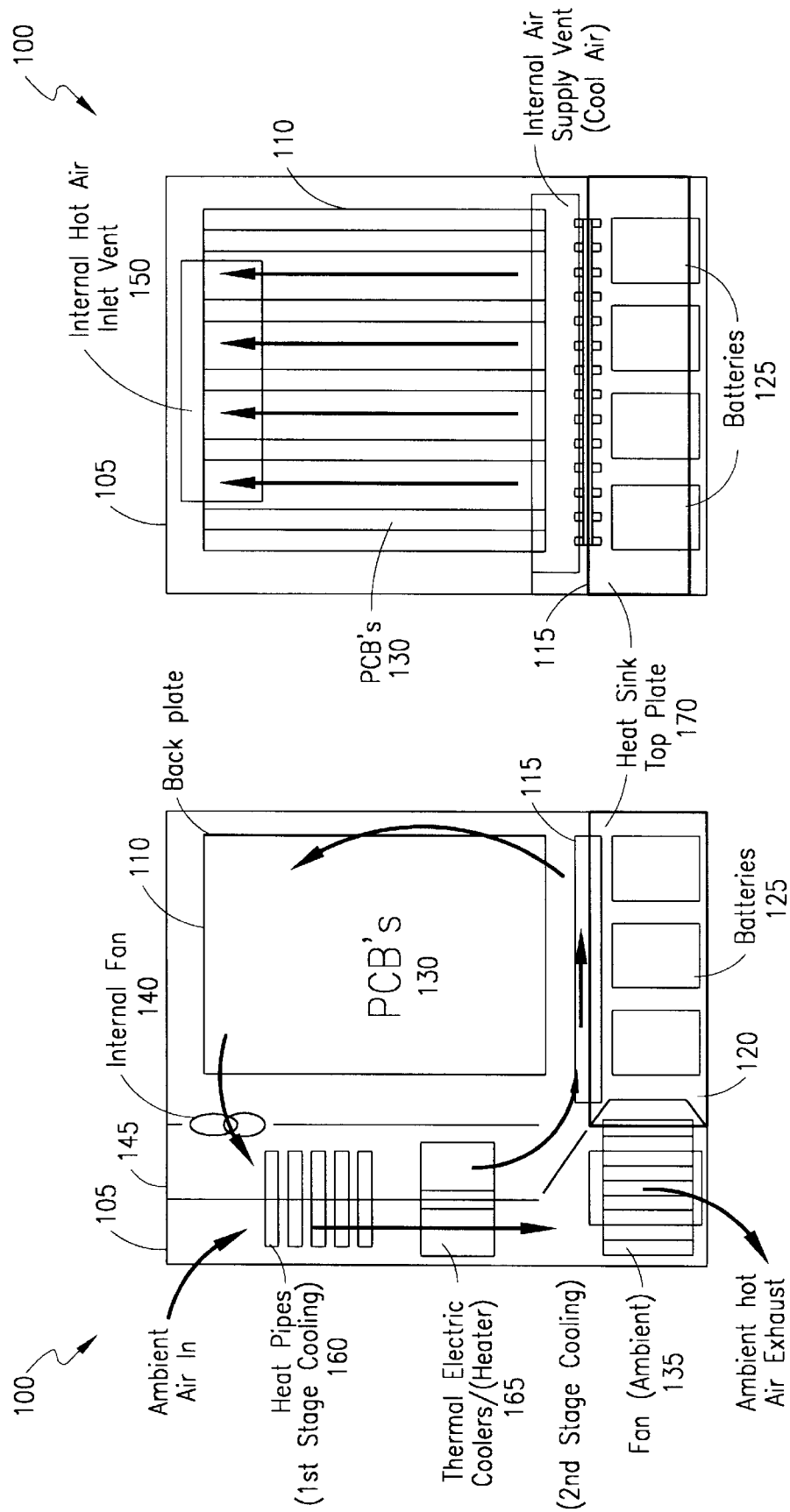
FIGS. 5A–5C are side, front, and perspective views of a base station heat management system according to the present invention.
Figure 5C:
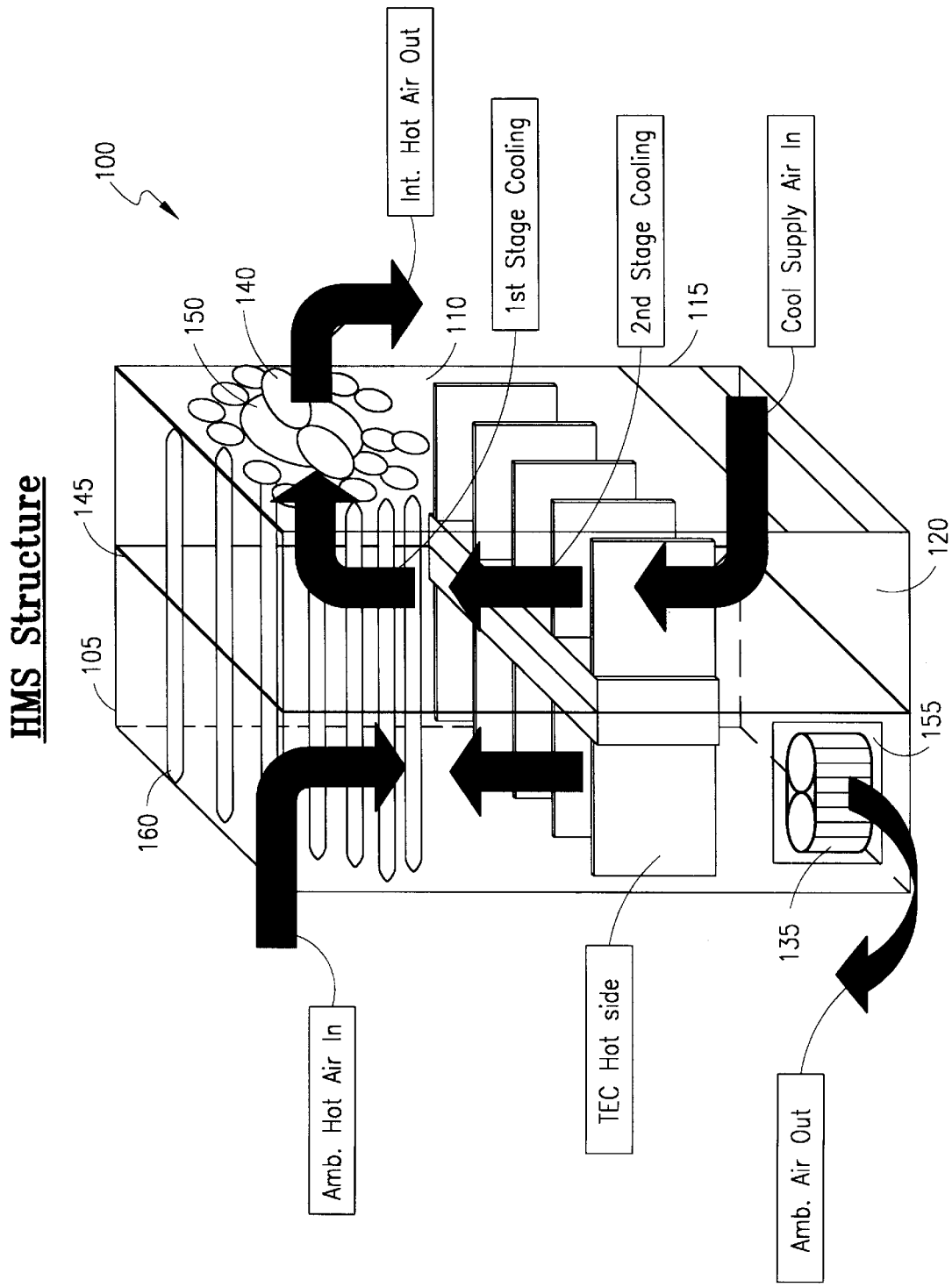

Referring now to FIGS. 5A, 5B, and 5C, side, front and perspective views of a base station heat management system (HMS) 100 according to the present invention are shown, respectively. System 100 comprises a main enclosure 105 forming a closed loop chamber 110. Main enclosure 105 encloses a battery housing 115, forming a battery chamber 120 separated and sealed from closed loop chamber 110. Battery housing 115 contains one or more batteries 125 for providing battery powered backup to system 100 in the event that primary power is lost. PCBs (Printed Circuit Boards) 130 and associated electronics for implementing some or all of the functional modules shown in FIG. 4, except the battery backup unit 82, are housed within the closed loop chamber 110.

As shown in FIGS. 5A and 5C, there are two fans, external fan 135, and internal fan 140. External fan 135 brings in ambient air from outside closed loop chamber 110 into ambient chamber 103, and fan 140 is inside closed loop chamber 110 to circulate internal air. Fans 135, 140 are separated by a chamber divider plate 145 to give closed loop internal air circulation within closed loop chamber 110. System 100 further comprises two ambient air vents, supply air vent 150, and exhaust air vent 155 in fluid communication with the ambient chamber 103. Air vent 150, supply, is located at the top, and second air vent 155, exhaust, is located at the bottom of ambient chamber 103 adjacent to where the batteries 125 are located. Due to the suction force provided by external fan 135, the supply air vent 150 pulls in ambient air into ambient chamber 103, forcing it across heat pipes 160 to get a first stage of cooling; the cooled air is then sent past a thermal electric cooler (TEC) 165 to get a second stage of cooling, and out the exhaust air vent 155. Cooled air circulated within enclosure 105 blows across a heat sink 170 by way of internal fan 140. Heat sink plate 170 divides and seals battery chamber 120 from closed loop chamber 110. As the cold air blows across the heat sink 170 surface, heat transfer will occur between the hot side (battery chamber 120) and the cold side (closed loop chamber 110) of the heat sink 170. Since there will be minimal heat generation by the batteries 125, heat transfer between the heat sink 170 surfaces and the internally circulating air should maintain battery chamber 120 temperature at about 55° C., given about a 50° C. ambient temperature. Battery chamber 120 walls may be insulated to block out solar radiation and/or to prevent the escape of heat. The surface of heat sink 170 may take on a finned arrangement to increase the heat transfer surface area. Internal air circulation may be additionally directed by way of the internal air duct 147 and internal plate 148.

Figure 6:
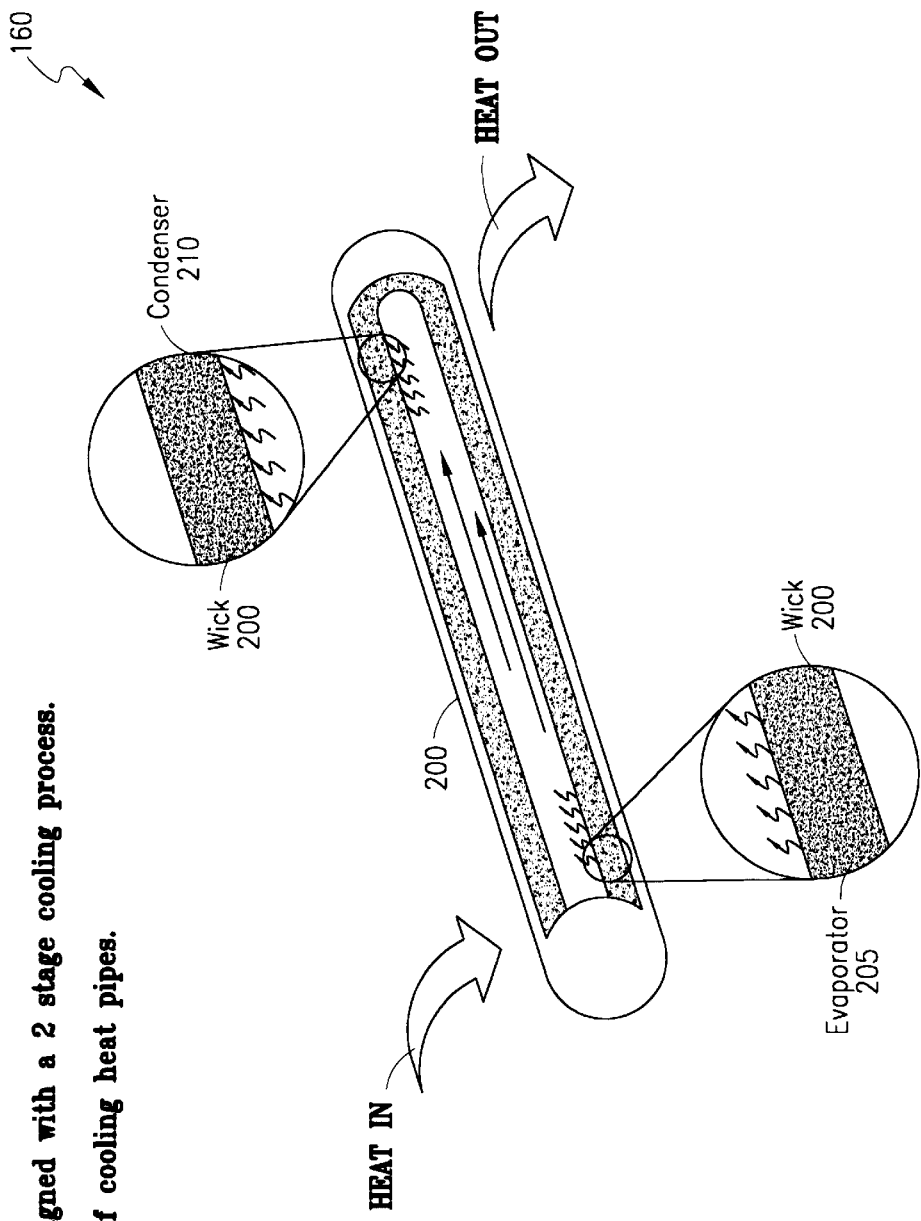
FIG. 6 is a detailed perspective view of cooling pipes utilized according to the present invention.

Referring now to FIG. 6, a detailed perspective view of cooling heat pipes 160 is shown. As shown, heat enters the left side 161 of pipe 160 and exits the right side 162 of pipe 160. Pipe 160 comprises a wick 200 which performs the function of an evaporator 205 on the left side 161 of pipe 160 and a condenser 210 on the right side 162 of pipe 160.

Figure 7:
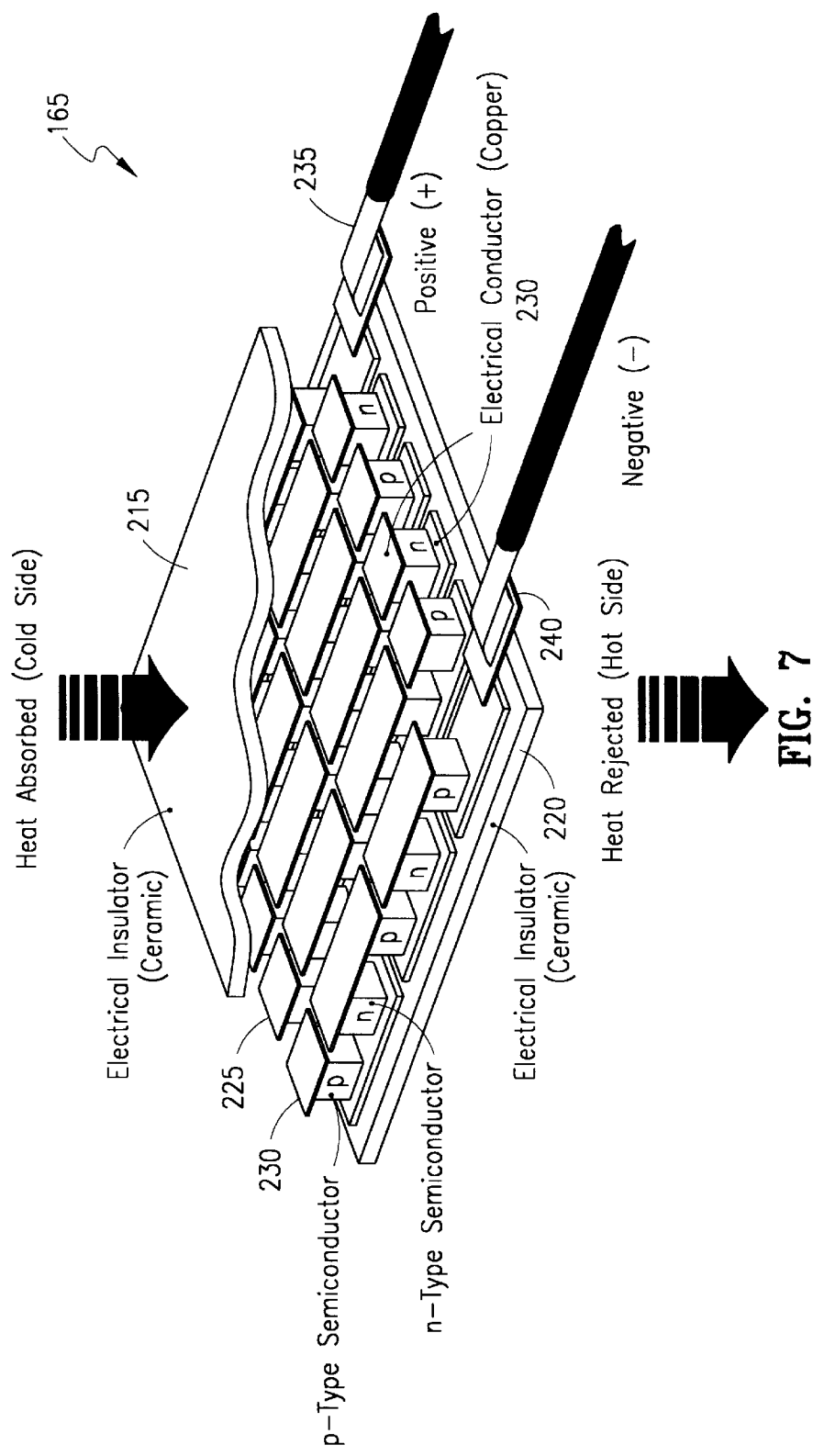
FIG. 7 is a detailed perspective view of thermoelectric cooling (TEC) elements utilized according to the present invention.

FIG. 7 is a detailed perspective view of a TEC 165 element. As shown, the TEC 165 comprises a cold side electrical insulator 215 and a hot side electrical insulator 220. Heat is absorbed by the cold side 215 and rejected by the hot side 220. The TEC 165 further includes a grid 225 of P-type and N-type semiconductor material plated with an electrical conductor 230 on two sides. TEC 165 further includes a positive lead 235 and a negative lead 240 for introducing a voltage potential across the grid 225.

Figure 8:
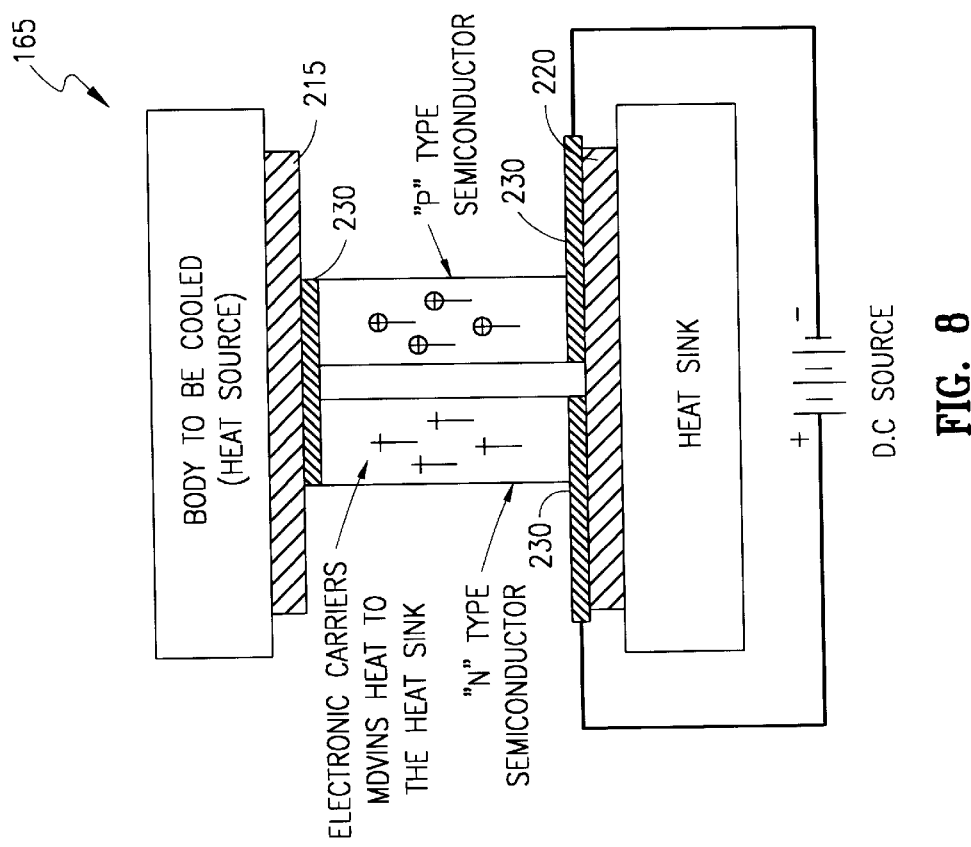
FIG. 8 illustrates the TEC cooling process according to the present invention.

FIG. 8 illustrates the operation of the TEC 165 wherein reference numerals which are like, similar or identical to reference numerals utilized in FIG. 7 indicate like, similar or identical components. Electrons carry heat from hot side 215 to cold side 220 when a DC voltage source 245 is impressed across the positive lead 235 and the negative lead 240. The direction of heat flow across the TEC 165 may be reversed by reversing the polarity of the applied voltage source 245.

Figure 9:
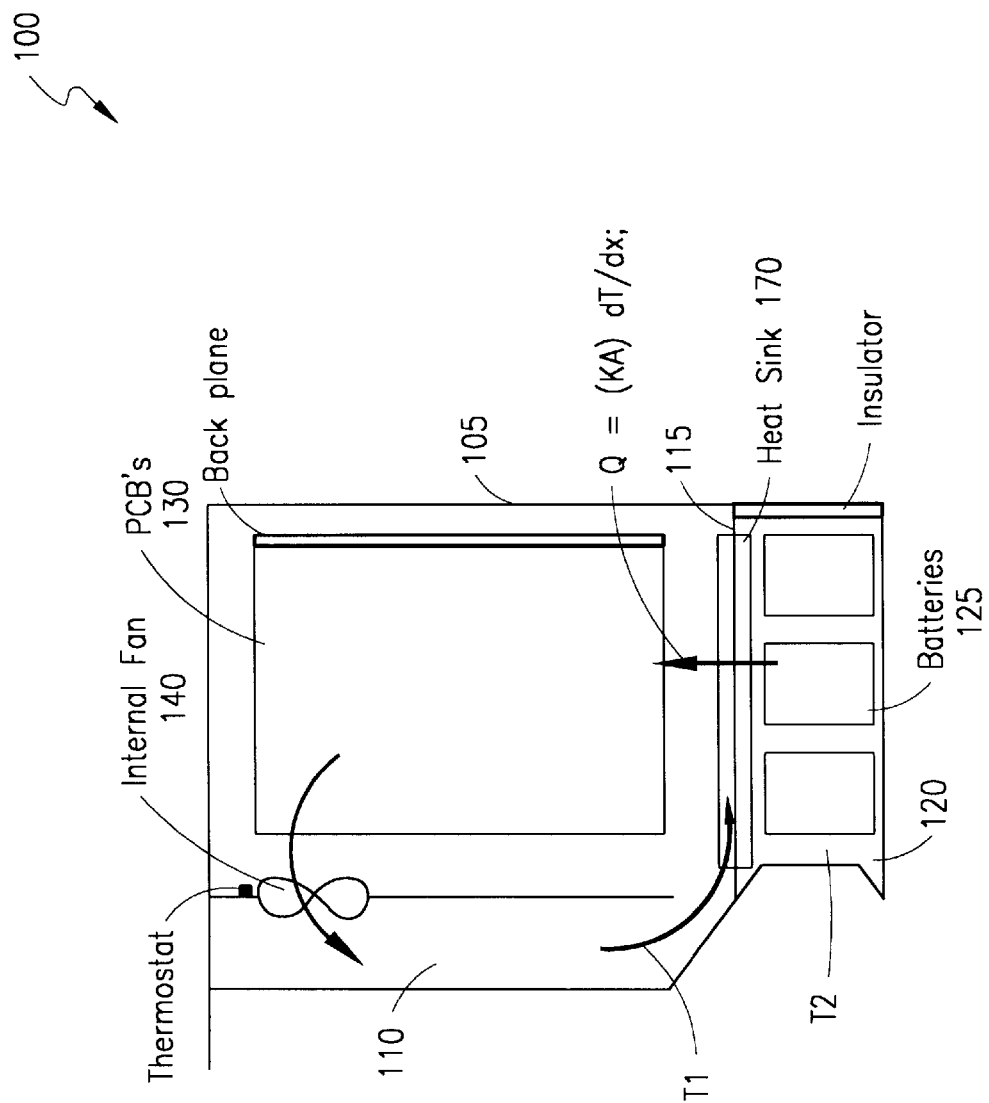
FIG. 9 is side view, partially cut-out, of the heat management system of FIGS. 5A–5C.

Referring now to FIG. 9, a partial cut-out view of the base station heat management system 100 shown in FIGS. 5A–5C is shown to further explain the operation of the system. Reference numerals used in FIG. 9 which are like, similar or identical to reference numerals used in FIGS. 5A–5C indicate like, similar or identical components. Although not shown, the invention anticipates using solely TEC 165 elements to cool the closed loop chamber 110, or solely the heat pipes 160 to cool the closed loop chamber 110. The unneeded elements (i.e., heat pipes 160 or TEC 165 elements, respectively) are simply left out of the system 100 construction.

A thermostat 250 is located near the internal fan 140 to monitor the internal air temperature T1 of the closed loop chamber 110. The thermostat 250 is connected to a heat management system controller (not shown) that controls both external and internal fans 135, and 140, and thermal electronic coolers 165. As the internal air temperature T1 increases, the heat management system controller acquires temperature readings from the thermostat 250 and responds by increasing the speed of fans 135 and 140. If internal temperature T1 continues to increase, the heat management system controller responds by applying more current to the thermoelectric coolers 165 to produce extra cooling, as needed, to keep the internal temperature T1 below a predetermined safe level.

If the temperature T1 falls below a desired nominal operating temperature (for example, operating at a temperature <+5° C.), the heat management system controller generates heat by reversing the current direction to the thermal electric coolers 165 (i.e., to reversing the polarity of the applied voltage). The heat management system controller turns off the power to the external fan 135 when the TEC elements 165 are in this heating mode of operation.

Figure 10:
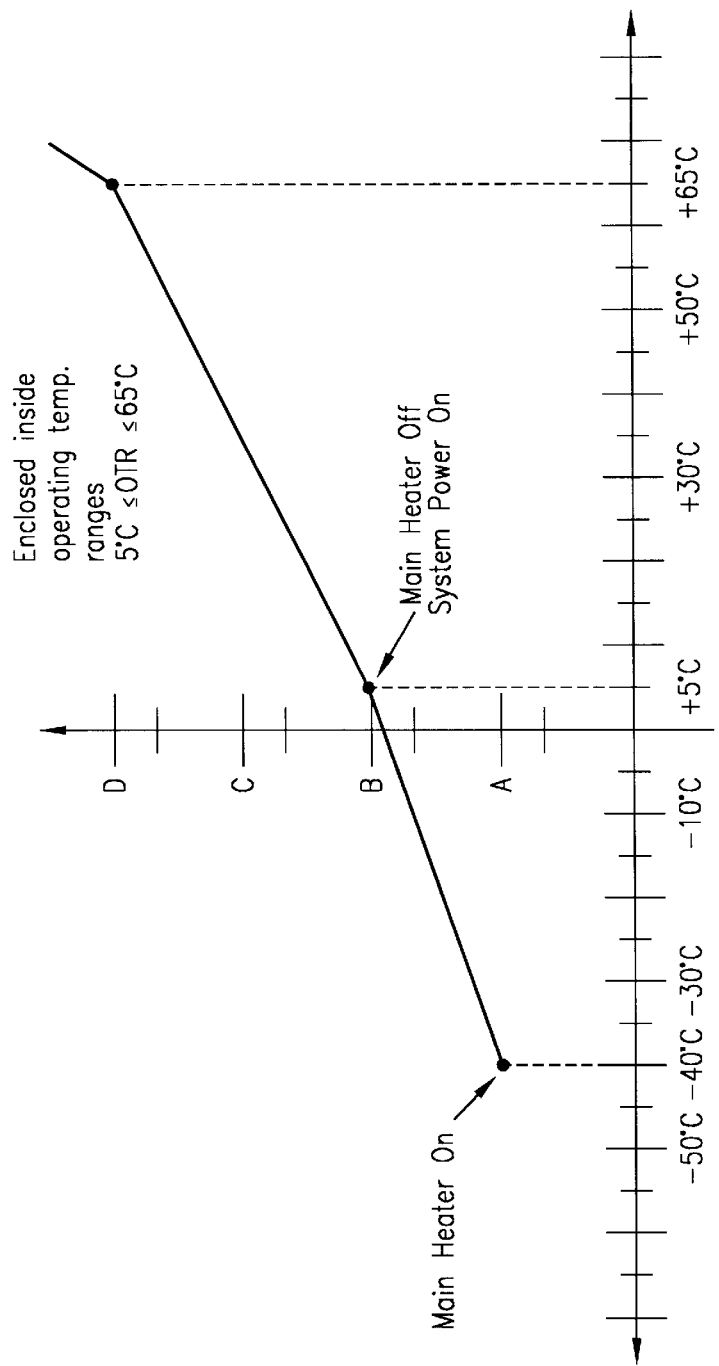
FIG. 10 is a graph illustrating operation of the heat management system according to one aspect of the present invention.

FIG. 10 is a graph which plots the above-described milestones as a function of temperature changes. It can be seen that for very cold temperatures, e.g., <+5° C., the thermal electric coolers 165 will be operated in a heating mode. Above this temperature, the thermal electric coolers 165 will be operated in a cooling mode and fans 135, 140 will be used as needed. Of course, these operating temperature ranges are approximate and may be readily varied to suit different applications.

Heating battery chamber 120 may also be accomplished using a flexible thermal heating element (not shown). Such units, readily available from the Watlo Company and others, are often used for those applications where cold temperatures are encountered on a constant basis. Typically, such heaters are made from a flexible insulating material, such as silicone rubber, NEOPRENE, KAPTON® (a thin, lightweight, organic polymer film), MYLAR® (another polymer film), and mica-insulated, high-temperature foil, mated to a wire-wound element (such as a fine resistance wire wrapped around a fiberglass cord), or etched foil, typically fabricated using an acid etching process for increased heater density and longer element life. The combination of a flexible insulating material and the previously mentioned elements produces a compact thermal heating assembly which provides uniformly dense heating at a low cost.

The base station heat management system 100 may be designed to distribute the cooling load between the first stage of heat pipe 160 elements and the second stage of thermal electrical cooler elements 165 in a variety of ways; typically, the division will be approximately 60% dissipated by the heat pipe 160 elements (i.e., passive) and 40% by the thermal electrical cooler 165 elements (i.e., active). Other divisions are also possible.

The present invention anticipates the maintenance of approximately 15° C. differential between the ambient air temperature and the enclosure main chamber 110 temperature. However, greater and lesser differentials are possible. In addition, the system 100 anticipates the use of a battery back-up system to provide auxiliary power during external power failure conditions.

The system 100 further anticipates the use of an electronic controller to monitor various temperatures throughout the system 100 and to maintain about a ±2° C. desired internal temperature range at any reasonable desired set point. The controller (not shown) anticipates the use of a built-in power supply and serial data port to provide external communications with the controller and system 100 status monitoring equipment.

While the invention has been particularly shown and described with reference to specific embodiments thereof, it will be understood by those skilled in the art that various changes in form and detail may be made thereto, and that other embodiments of the present invention beyond embodiments specifically described herein may be made or practiced without departing from the spirit and scope of the present invention as limited solely by the appended claims.

We claim:

1. A heat management system for an enclosure comprising:
    an ambient chamber contiguous with a closed loop chamber;
    a battery chamber contiguous with said closed loop chamber, said battery chamber being insulated;
    a supply vent in fluid communication with said ambient chamber;
    one or more heat pipes in thermal communication with said ambient chamber and said closed loop chamber;
    one or more thermal electric cooling elements in thermal communication with said ambient chamber and said closed loop chamber;
    an external fan in fluid communication with said ambient chamber;
    an exhaust vent in fluid communication with said ambient chamber;
    an internal fan in fluid communication with said closed loop chamber; and
    a heat sink in thermal communication with said closed loop chamber and said battery chamber.

2. The heat management system of claim 1, wherein said external fan operates to draw ambient air into said supply vent, across said heat pipes, across said thermal electric cooling elements, and out of said exhaust vent.

3. The heat management system of claim 1, wherein said internal fan operates to draw internal air across said heat pipes and across said thermal electric cooling elements.

4. The heat management system of claim 1, wherein said internal fan operates to draw internal air across said heat sink.

5. The heat management system of claim 1, further comprising an air duct in fluid communication with said internal fan.

6. The heat management system of claim 1, wherein the temperature of said battery chamber is maintained at substantially 55° C. when the temperature of said ambient air is about 50° C.

7. The heat management system of claim 1, wherein said battery chamber is heated.

8. The heat management system of claim 1, wherein said thermal electric cooling elements are used to heat said closed loop chamber.

9. The heat management system of claim 1, further comprising a thermostat for monitoring the temperature of said closed loop chamber.

10. The heat management system of claim 1, further comprising a heat management system controller for controlling the operation of said internal fan, said external fan, and said thermal electric cooling elements.

11. The heat management system of claim 10, wherein said heat management system controller is used to control the operating speed of said internal and external fans.

12. The heat management system of claim 1, further comprising a heat management system controller which uses a thermostat to monitor the temperature of said closed loop chamber.

13. A heat management system for an enclosure comprising:
    an ambient chamber contiguous with a closed loop chamber;
    a battery chamber contiguous with said closed loop chamber said battery chamber being temperature controlled by said heat management system;
    a supply vent in fluid communication with said ambient chamber;
    one or more heat pipes in thermal communication with said ambient chamber and said closed loop chamber;
    an external fan in fluid communication with said ambient chamber;
    an exhaust vent in fluid communication with said ambient chamber;
    an internal fan in fluid communication with said closed loop chamber; and
    a heat sink in thermal communication with said closed loop chamber and said battery chamber.

14. The heat management system of claim 13, wherein said external fan operates to draw ambient air into said supply vent, across said heat pipes, and out of said exhaust vent.

15. The heat management system of claim 13, wherein said internal fan operates to draw internal air across said heat pipes.

16. The heat management system of claim 13, wherein said internal fan operates to draw internal air across said heat sink.

17. The heat management system of claim 13, further comprising an air duct in fluid communication with said internal fan.

18. The heat management system of claim 13, wherein said battery chamber is heated and cooled.

19. The heat management system of claim 13, wherein one or more thermal electric cooling elements are used to heat said closed loop chamber.

20. The heat management system of claim 13, further comprising a thermostat is used to monitor the temperature of said closed loop chamber.

21. The heat management system of claim 13, further comprising a heat management system controller for controlling the operation of said internal and external fans.

22. The heat management system of claim 13, wherein said heat management system controller is used to control the operating speed of said internal and external fans.

23. A heat management system for an enclosure comprising:

an ambient chamber contiguous with a closed loop chamber;

a battery chamber contiguous with said closed loop chamber;

a supply vent in fluid communication with said ambient chamber;

one or more thermal electric cooling elements in thermal communication with said ambient chamber and said closed loop chamber;

an external fan in fluid communication with said ambient chamber;

an exhaust vent in fluid communication with said ambient chamber;

an internal fan in fluid communication with said closed loop chamber; and a heat sink in thermal communication with said closed loop chamber and said battery chamber.

24. The heat management system of claim 23, wherein said external fan operates to draw ambient air into said supply vent, across said thermal electric cooling elements, and out of said exhaust vent.

25. The heat management system of claim 23, wherein said internal fan operates to draw internal air across said thermal electric cooling elements.

26. The heat management system of claim 23, wherein said internal fan operates to draw internal air across said heat sink.

27. The heat management system of claim 23, further comprising an air duct in fluid communication with said internal fan.

28. The heat management system of claim 23, wherein said battery chamber is heated.

29. The heat management system of claim 23, wherein said thermal electric cooling elements are used to heat said closed loop chamber.

30. The heat management system of claim 23, wherein a thermostat is used to monitor the temperature of said closed loop chamber.

31. The heat management system of claim 23, further comprising a heat management system controller for controlling the operation of said internal and external fans.

32. The heat management system of claim 23, wherein said heat management system controller is used to control the operating speed of said internal and external fans.

33. A heat management system for a wireless communication base station enclosure comprising:

an ambient chamber contiguous with a closed loop chamber;

a battery chamber contiguous with said closed loop chamber said battery chamber being heated;

a supply vent in fluid communication with said ambient chamber;

one or more heat pipes in thermal communication with said ambient chamber and said closed loop chamber;

one or more thermal electric cooling elements in thermal communication with said ambient chamber and said closed loop chamber;

an external fan in fluid communication with said ambient chamber;

an exhaust vent in fluid communication with said ambient chamber;

an internal fan in fluid communication with said closed loop chamber; and a heat sink in thermal communication with said closed loop chamber and said battery chamber.

34. The heat management system of claim 33, wherein said external fan operates to draw ambient air into said supply vent, across said heat pipes, across said thermal electric cooling elements, and out of said exhaust vent.

35. The heat management system of claim 33, wherein said internal fan operates to draw internal air across said heat pipes and across said thermal electric cooling elements.

36. The heat management system of claim 33, wherein said internal fan operates to draw internal air across said heat sink.

37. The heat management system of claim 33, further comprising an air duct in fluid communication with said internal fan.

38. The heat management system of claim 33, wherein said battery chamber is insulated.

39. The heat management system of claim 33, wherein the temperature of said battery chamber is maintained substantially at 55° C. when the temperature of said ambient air is about 50° C.

40. The heat management system of claim 33, wherein said thermal electric cooling elements are used to heat said closed loop chamber.

41. The heat management system of claim 33, further comprising a thermostat monitoring the temperature of said closed loop chamber.

42. The heat management system of claim 33, further comprising a heat management system controller for controlling the operation of said internal fan, said external fan, and said thermal electric cooling elements.

43. The heat management system of claim 42, further comprising said system controller which is used to control the operating speed of said internal and external fans.

44. The heat management system of claim 33, wherein a heat management system controller uses a thermostat to monitor the temperature of said closed loop chamber.

45. A method of heat management for an enclosure comprising the steps of:

drawing ambient air into a supply vent using an external fan, said supply vent and said external fan being in fluid communication with an ambient chamber, said ambient chamber contiguous with a closed loop chamber, said closed loop chamber being contiguous with a battery chamber;

drawing ambient air past one or more thermal electric cooling elements, said one or more thermal electric cooling elements being in thermal communication with said ambient chamber and said closed loop chamber;

drawing ambient air out of an exhaust vent, said exhaust vent being in fluid communication with said ambient chamber; and circulating internal air past a heat sink using an internal fan, said internal fan being in fluid communication with said closed loop chamber and said heat sink being in thermal communication with said closed loop chamber and said battery chamber.

46. The method of heat management claimed in claim 45, further comprising the step of drawing internal air across said thermal electric cooling elements.

47. The method of heat management claimed in claim 45, further comprising the step of drawing internal air through an air duct using said internal fan, said air duct being in fluid communication with said internal fan.

48. The heat management method claimed in claim 45, further comprising the step of heating said closed loop chamber using said thermal electric cooling elements.

49. The heat management method claimed in claim 45, further comprising the step of changing the operating speed of said internal and external fans.

50. The heat management method claimed in claim 45, further comprising the step of drawing ambient air past one or more heat pipes, said one or more heat pipes being in thermal communication with said ambient chamber and said closed loop chamber.

51. The method of heat management claimed in claim 50, further comprising the step of drawing internal air across said heat pipes.

* * * * *